United States Patent
Baek et al.

(10) Patent No.: US 7,910,437 B1
(45) Date of Patent: Mar. 22, 2011

(54) METHOD OF FABRICATING VERTICAL CHANNEL SEMICONDUCTOR DEVICE

(75) Inventors: Seong-Hak Baek, Cheongju-si (KR); Min-Su Ahn, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 12/912,558

(22) Filed: Oct. 26, 2010

(30) Foreign Application Priority Data

Nov. 19, 2009 (KR) .................. 10-2009-0111886

(51) Int. Cl.
*H01L 21/336* (2006.01)
(52) U.S. Cl. .................. 438/268; 257/E21.629
(58) Field of Classification Search .................. 438/268, 438/270; 257/E21.629
See application file for complete search history.

(56) References Cited

U.S. PATENT DOCUMENTS

| 6,198,127 | B1 | 3/2001 | Kocon |
| 6,433,385 | B1 | 8/2002 | Kocon et al. |
| 6,673,681 | B2 | 1/2004 | Kocon et al. |
| 7,368,352 | B2 * | 5/2008 | Kim et al. ............ 438/268 |
| 7,560,344 | B2 * | 7/2009 | Kim et al. ............ 438/270 |
| 7,679,146 | B2 * | 3/2010 | Tu et al. .............. 257/401 |
| 2009/0242971 | A1 * | 10/2009 | Cho et al. ............ 257/328 |

* cited by examiner

*Primary Examiner* — W. David Coleman
(74) *Attorney, Agent, or Firm* — NSIP Law

(57) ABSTRACT

A method for fabricating a semiconductor device may include: forming an outer trench, including: a first trench, and a second trench formed under the first trench, the second trench being formed by etching a substrate, forming a dielectric layer, which fills the second trench, by performing a thermal oxidation process, such that a width of the second trench is less than a width of the first trench, forming a gate dielectric layer along a surface of a semiconductor structure including the dielectric layer, and forming a gate electrode, which fills a remaining portion of the outer trench, over the gate dielectric layer.

19 Claims, 7 Drawing Sheets

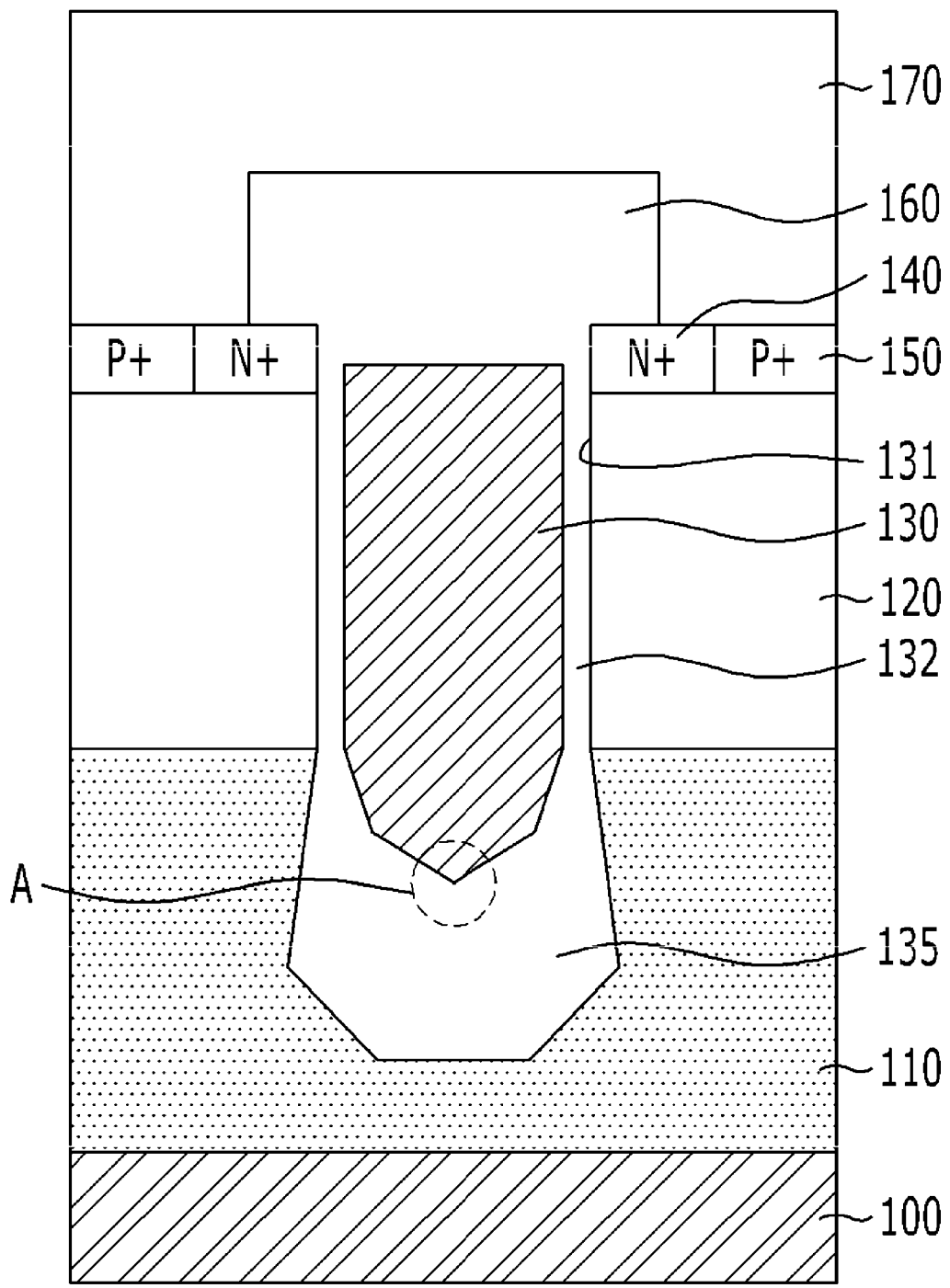

METHOD OF FABRICATING VERTICAL CHANNEL SEMICONDUCTOR DEVICE

CROSS-REFERENCE TO RELATED APPLICATION(S)

This application claims the benefit under 35 U.S.C. §119 (a) of Korean Patent Application No. 10-2009-0111886, filed on Nov. 19, 2009, the entire disclosure of which is incorporated herein by reference for all purposes.

BACKGROUND

1. Field

The following description relates to a semiconductor device fabricating technology, and, more particularly, to a method for fabricating a semiconductor device for a high voltage with a vertical channel. More particularly, the following description also relates to a method of fabricating a trench metal-oxide-semiconductor (MOS) transistor.

2. Description of Related Art

In a metal-oxide-semiconductor (MOS) transistor, such as a DMOS (double diffused MOS) transistor, which is mainly used as a semiconductor device for a high voltage, a channel is generally formed in a direction parallel to the surface of a substrate. However, recently, as the design rule of a semiconductor device decreases, a MOS transistor for a high voltage with a vertical channel to be advantageous in terms of high degree of integration, that is, a "trench MOS" transistor is becoming of greater concern. Describing briefly the structure of the trench MOS transistor, a drain is disposed on the lower surface of a substrate, a source is disposed on the upper surface of the substrate, and a gate electrode is disposed in a trench defined in the surface of the substrate. Current flows along the sidewalls of the trench in upward and downward directions of the substrate.

When designing the trench MOS transistor having the above-described structure, it is desirable to minimize a capacitance component to increase a switching speed. To this end, the present Applicants have disclosed "Trench MOSFET and Fabricating Method thereof" on Nov. 19, 2007 (see Korean Patent Laid-open Publication No. 10-2009-0051642). In the patent document, a diffused oxide layer is formed under a trench to have a width greater than the trench in an effort to minimize a capacitance component between a gate electrode and a drain region or a drift region, thereby increasing a switching speed. Hereafter, the fabricating method of the trench MOS transistor disclosed by the present applicant will be described with reference to FIG. 1.

FIG. 1 is a cross-sectional view illustrating a conventional trench MOS transistor.

Describing a conventional method for fabricating a trench MOS transistor with reference to FIG. 1, a trench 131 is defined by selectively etching a substrate 100 which includes an epi-layer 110 serving as a drain region (or a drift region) and a body layer 120. After forming spacers (not shown) on the sidewalls of the trench 131, a portion of the substrate 100, which is placed under the trench 131, is etched using the spacers as an etch barrier, and thereby, a groove (not shown) for forming a diffused oxide layer is defined. A diffused oxide layer 135, which has a width greater than the trench 131, is formed by performing a thermal oxidation process. After removing the spacers, a first gate oxide layer 132 is formed. A gate 130 is formed to fill the trench 131, and a source region 140, a contact region 150, a second gate oxide layer 160, and an upper metal 170 are formed.

In the conventional art, while the capacitance between the gate 130 and the epi-layer 110 serving as the drain region may be decreased by forming the diffused oxide layer 135 with the width greater than the trench 131, a problem is caused in that a switching speed decreases due to the capacitance between the gate 130 and the substrate 100 (actually, a drain). Also, because the width of the diffused oxide layer 135 disposed between the gate 130 and the substrate 100 is greater than that of the trench 131, a problem is caused in that the capacitance between them further increases.

Moreover, while thermal oxidation is used when forming the diffused oxide layer 135, due to the characteristics of the thermal oxidation in which an oxide layer grows from the surface of the substrate 100, a keyhole may be created in the diffused oxide layer 135 (see the reference symbol "A"), whereby the characteristics of a semiconductor device are likely to be degraded.

SUMMARY

An embodiment may be directed to a method for fabricating a semiconductor device, which may increase the switching speed of a trench MOS transistor.

Another embodiment may be directed to a method for fabricating a semiconductor device, which may prevent the characteristics of a trench MOS transistor from being degraded due to the presence of a keyhole.

In one general aspect, there is provided a method for fabricating a semiconductor device, the method including: forming an outer trench, including: a first trench, and a second trench formed under the first trench, the second trench being formed by etching a substrate, forming a dielectric layer, which fills the second trench, by performing a thermal oxidation process, such that a width of the second trench is less than a width of the first trench, forming a gate dielectric layer along a surface of a semiconductor structure including the dielectric layer, and forming a gate electrode, which fills a remaining portion of the outer trench, over the gate dielectric layer.

The method may further include, before forming the first trench, forming a drain region of a second conductivity type over a lower surface of the substrate.

In the method, the dielectric layer may include a silicon oxide layer.

In the method, the forming of the trench may include: forming a hard mask pattern over the substrate, forming the first trench by etching the substrate using the hard mask pattern as an etch barrier, forming spacers on sidewalls of the first trench, and forming the second trench by etching a portion of the substrate which is placed under the first trench, using the hard mask pattern and the spacers as an etch barrier.

The method may further include, before forming the spacers: forming a sacrificial dielectric layer over surfaces of the first trench, and etching partially the sacrificial dielectric layer to be flush with edges of the hard mask pattern.

In the method, the forming of the spacers may include: forming a nitride layer over the sacrificial dielectric layer, and forming the spacers by performing a blanket etching process for the nitride layer.

In the method, the sacrificial dielectric layer may be formed through a thermal oxidation process.

In the method: the sacrificial dielectric layer may include an oxide layer, and the spacers may include a nitride layer.

The method may further include forming a deformation preventing layer over the lower surface of the substrate at the same time as forming the hard mask pattern.

In the method, each of the hard mask pattern and the deformation preventing layer may be formed as a triple layer in which an oxide layer, a nitride layer, and an oxide layer are sequentially stacked.

In the method, the forming of the gate dielectric layer may be implemented on an entire exposed surface of the substrate by performing a thermal oxidation process, after the hard mask pattern, the spacers, and the sacrificial dielectric layer are removed.

The method may further include, before the forming of the gate dielectric layer, filling a keyhole created in the dielectric layer.

In the method, the filling of the keyhole may include: depositing a sacrificial layer along a surface of a structure to fill the keyhole created in the dielectric layer, converting the sacrificial layer into the same layer as the dielectric layer, and removing the other portion of the sacrificial layer, except one portion of the sacrificial layer filled in the keyhole.

In the method: the sacrificial layer may include a silicon layer, and the sacrificial layer may be converted into a silicon oxide layer through a thermal oxidation process performed under an oxygen atmosphere.

In the method, the sacrificial layer may be formed to have a thickness capable of filling the keyhole.

In the method, the sacrificial layer may be formed to have a thickness of approximately 200 Å to approximately 400 Å.

The method may further include, after the forming of the gate electrode: forming a well of a first conductivity type in the substrate on each side of the trench, forming a source region of a second conductivity type in the well, forming an interlayer dielectric layer on an entire surface of the substrate, forming a contact hole which exposes the well through the source region, by selectively etching the interlayer dielectric layer and the substrate, forming a contact region by implanting impurity ions of the first conductivity type into a bottom surface of the contact hole, and forming a wiring line which fills the contact hole.

In the method, a depth of the well may be set to be the same as or less than a depth of the first trench from a perspective of an upper surface of the substrate.

The method may further include, before the forming of the gate dielectric layer, filling a keyhole created in the dielectric layer.

Other features and aspects may be apparent from the following detailed description, the drawings, and the claims.

BRIEF DESCRIPTION OF THE DRAWINGS

FIG. 1 is a cross-sectional view illustrating a conventional trench MOS transistor.

Figure 2A:
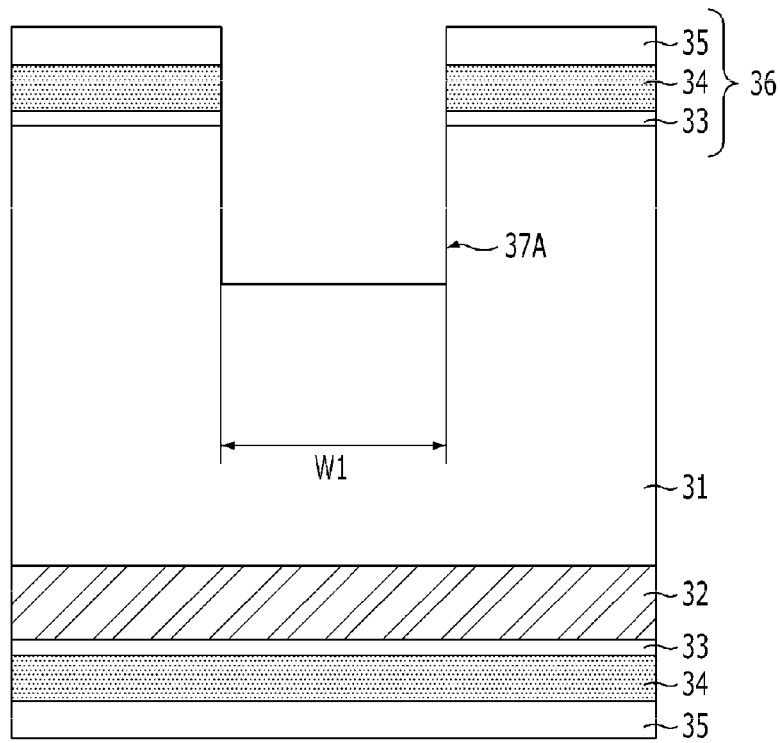
FIGS. 2A through 2K are cross-sectional views illustrating the processes of a method for fabricating a trench MOS transistor in accordance with an embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

When a first layer is referred to as being "on" a second layer or "on" a substrate, it not only refers to a case where the first layer is formed directly on the second layer or the substrate but also a case where a third layer exists between the first layer and the second layer or the substrate.

The term "substrate" used herein may be any supporting structure including, but not limited to, a semiconductor substrate having a surface on which devices may be fabricated. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation.

An embodiment which will be described below provides a method for fabricating a semiconductor device, which may increase the switching speed of a trench metal-oxide-semiconductor (MOS) transistor. Hereafter, in the embodiment, a trench MOS transistor with an N-type channel will be described. Accordingly, in the following description, a first conductivity type indicates a P-type, and a second conductivity type indicates an N-type. Of course, the technical features of embodiments may be applied in the same manner to a P-type DMOS transistor. In such an example, a first conductivity type may indicate an N-type and a second conductivity type indicates a P-type.

FIGS. 2A through 2K are cross-sectional views illustrating the processes of a method for fabricating a trench MOS transistor in accordance with an embodiment.

Referring to FIG. 2A, stack layers, each of which may have first, second and third hard mask layers 33, 34, and 35 sequentially stacked therein, may be respectively formed on the upper and lower surfaces of a substrate 31 of a second conductivity type, which may have a drain region 32 of a second conductivity type formed on the back surface thereof. A silicon substrate may be used as the substrate 31. The substrate 31 of the second conductivity type may serve as a drift region.

The first hard mask layer 33 and the third hard mask layer 35 may be formed as oxide layers. For example, the first hard mask layer 33 may be formed as a silicon oxide layer ($SiO_2$) through thermal oxidation to have a thickness, for example, of approximately 500 Å, and the third hard mask layer 35 may be formed as an oxide layer through HLD (high-temperature low-pressure deposition) to have a thickness, for example, of approximately 2,000 Å. The second hard mask layer 34 may be formed, for example, as a nitride layer, e.g., a silicon nitride layer ($Si_3N_4$), using a material with an etching selectivity that may be different from the first and third hard mask layers 33 and 35, to have a thickness, for example, of approximately 1,400 Å.

The first, second, and third hard mask layers 33, 34, and 35, which may be formed on the upper and lower surfaces of the substrate 31, may serve not only as hard masks but also as deformation preventing layers for preventing deformation of the substrate 31 during subsequent processes.

After forming a hard mask pattern 36 by selectively etching the first, second, and third hard mask layers 33, 34, and 35 formed on the upper surface of the substrate 31, the substrate 31 may be etched by a predetermined depth by using the hard mask pattern 36 as an etch barrier, by which a first trench 37A may be defined. An etching process for defining the first trench 37A may be performed through dry etching, for example, plasma etching. This may allow the sidewalls of the first trench 37A to have vertical profiles. A width of the first trench 37A is denoted by "W1".

Figure 2B:
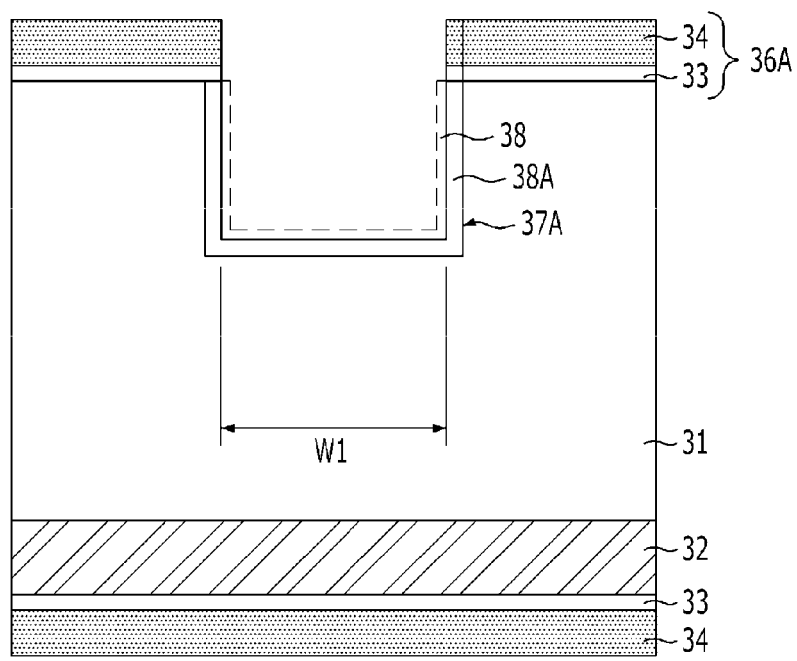

Referring to FIG. 2B, in order to remove by-products which may be produced in the course of defining the first trench 37A, a cleaning process may be performed. When removing the by-products through the cleaning process, the third hard mask layers 35 formed on the upper and lower surfaces of the substrate 31 may be simultaneously removed. The hard mask pattern 36, from which the third hard mask layer 35 is removed, is designated by the reference numeral 36A.

A sacrificial dielectric layer 38 may be formed on the surfaces, that is, the sidewalls and the bottom surface, of the first trench 37A having undergone the cleaning process. The sacrificial dielectric layer 38 may function to cure damages on the surfaces of the first trench 37A which may have occurred while performing the etching process for defining the first trench 37A, and to protect the surfaces of the first trench 37A while performing subsequent processes. The sacrificial dielectric layer 38 may be formed to have a thickness, for example, of approximately 1,000 Å. The sacrificial dielectric layer 38, which may function as described above, may be formed as an oxide layer, for example, a silicon oxide layer. The silicon oxide layer used as the sacrificial dielectric layer 38 may be formed through thermal oxidation to more effectively cure the damages on the surfaces of the first trench 37A.

Due to the characteristics of the thermal oxidation in which the oxide layer is formed by partially oxidizing the substrate 31, portions of the sacrificial dielectric layer 38 may project on the surfaces of the first trench 37A in such a way as not to be flush with the edges of the hard mask pattern 36A, and the other portions of the sacrificial dielectric layer 38 may remain in the substrate 31.

The sacrificial dielectric layer 38 may be partially etched to be flush with the edges of the hard mask pattern 36. That is to say, the portions of the sacrificial dielectric layer 38, which may project into the first trench 37A beyond the edges of the hard mask pattern 36A, may be selectively removed.

An etching process for partially etching the sacrificial dielectric layer 38 may be performed through wet etching, and a hydrofluoric acid (HF) solution or a BOE (buffered oxide etchant) solution may be used as an etching solution. For example, in an example in which the sacrificial dielectric layer 38 is formed to a thickness, e.g., of approximately 1,000 Å, approximately 400 Å of the sacrificial dielectric layer 38 may be etched through the etching process. The etching thickness of the sacrificial dielectric layer 38 may be controlled by controlling an etching time.

One reason why the sacrificial dielectric layer 38 may be etched to be flush with the edges of the hard mask pattern 36A is to ensure that, in a subsequent process for forming spacers, the thickness of the spacers may be prevented from locally decreasing due to the projecting portions of the sacrificial dielectric layer 38, improving the stability of the subsequent process.

The sacrificial dielectric layer 38, which may be etched to be flush with the edges of the hard mask pattern 36A, will be designated by the reference numeral 38A.

Figure 2C:
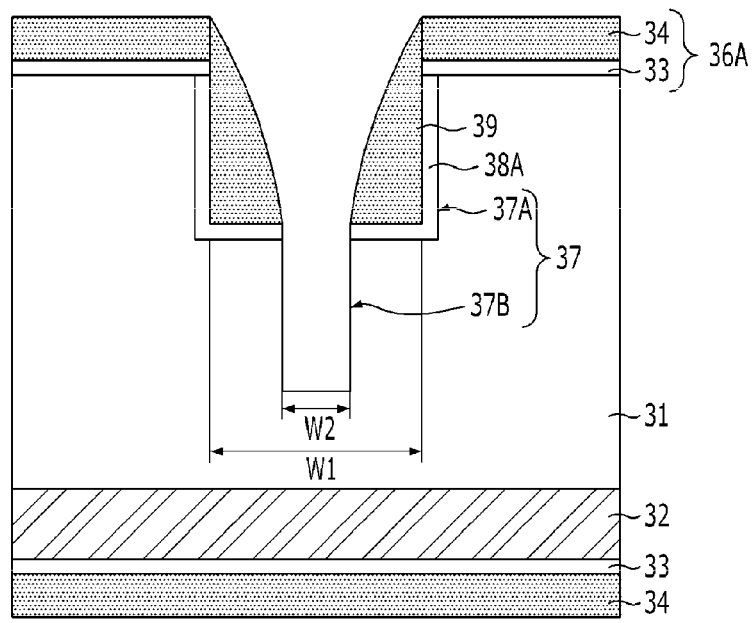

Referring to FIG. 2C, spacers 39 may be formed on the sidewalls of the hard mask pattern 36A and the sidewalls of the first trench 37A. The spacers 39 may be formed as a nitride layer using the same material as the second hard mask layer 34, to have a thickness of, for example, approximately 1,000 Å.

As an example, as the spacers 39 may be formed by performing a blanket etching process after depositing a nitride layer on the surfaces of the first trench 37A in the semiconductor structure shown in FIG. 2B, the spacers 39 may have a thickness gradually decreasing from the lower ends thereof to the upper ends thereof. In this regard, if the sacrificial dielectric layer 38A has a shape which projects into the first trench 37A beyond the edges of the hard mask pattern 36A, the thickness of the upper portions of the spacers 39 may be further decreased due to the presence of the projecting portions of the sacrificial dielectric layer 38A, for example, due to the presence of the portions of the sacrificial dielectric layer 38A projecting at the upper part (or entrance part) of the first trench 37A. Otherwise the upper portions of the spacers 39 may be abnormally formed such that the sacrificial dielectric layer 38A is exposed.

However, in one embodiment, due to the fact that the sacrificial dielectric layer 38 may be partially etched, as described above, such that the sacrificial dielectric layer 38A may be flush with the edges of the hard mask pattern 36A, it may be possible to prevent the spacers 39 from being abnormally formed. Thus, it may be possible to avoid processing errors that may otherwise occur due to abnormal forming of the spacers 39.

A portion of the sacrificial dielectric layer 38A, which may be formed on the bottom surface of the first trench 37A, may be etched using the hard mask pattern 36A and the spacers 39 as an etch barrier, and in succession, a second trench 37B may be defined by etching a portion of the substrate 31 which may be placed under the bottom surface of the first trench 37A. A width of the second trench 37B is denoted by "W2". An outer trench, which is includes the first and second trenches 37A and 37B, will be designated by the reference numeral 37.

Particularly, the width W2 of the second trench 37B may be set to be less than the width W1 of the first trench 37A to reduce the specific on-resistance of a semiconductor device. The width W2 of the second trench 37B may be controlled through controlling the thickness of the spacers 39. The depth (or height) of the second trench 37B may be set to be the same as the height of the first trench 37A. However, the depth (or height) of the second trench 37B may be set to be greater or less than the height of the first trench 37A, depending upon the desired characteristics of the semiconductor device.

Figure 2D:
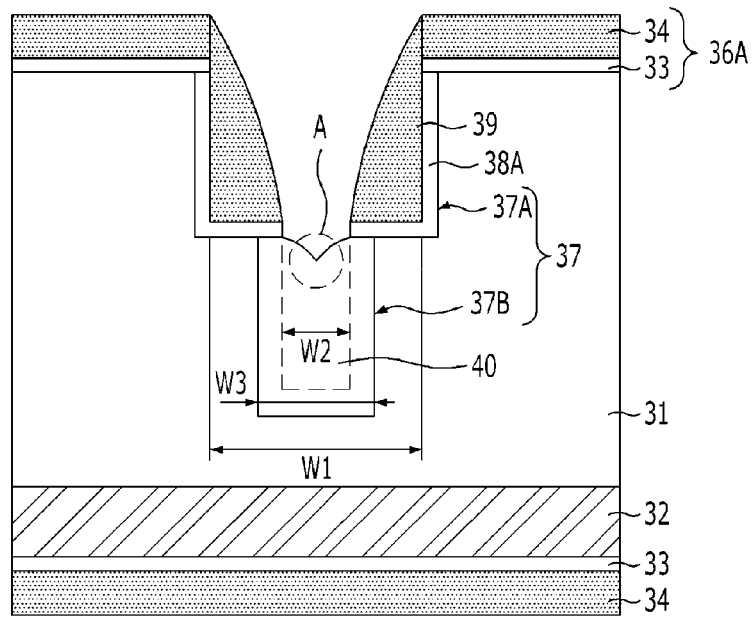

Referring to FIG. 2D, after a cleaning process is performed to remove by-products which may be produced in the course of defining the second trench 37B, a dielectric layer 40 may be formed to fill the second trench 37B. A width W3 of the dielectric layer 40 may be set to be less than the width W1 of the first trench 37A (e.g., W1>W3). Also, W1>W3>W2.

The dielectric layer 40 may function to decrease the capacitance between a gate electrode (e.g., gate electrode 44A in FIG. 2H below), which may be formed through a subsequent process, and the drain region 32, and may be formed as an oxide layer, for example, a silicon oxide layer, to have a thickness of, e.g., approximately 2,200 Å. For example, in order to allow the dielectric layer 40 filling the second trench 37B to have more improved film quality, cure the damages on the surfaces of the second trench 37B, and increase the height of the dielectric layer 40 to be greater than the preset depth of the second trench 37B and more effectively decrease the capacitance between the gate electrode and the drain region 32, the dielectric layer 40 may be formed as an oxide layer through thermal oxidation. Due to the characteristics of the thermal oxidation in which the oxide layer may be formed by partially oxidating the substrate 31, the dielectric layer 40 may be formed to have a height greater than the height of the second trench 37B and the width W3 greater than the width W2 of the second trench 37B. Therefore, when initially defining the second trench 37B, the second trench 37B may be determined in consideration of the above.

In order to form the dielectric layer 40 with the thickness of, e.g., approximately 2,200 Å through the thermal oxidation, it may be desirable to perform a thermal oxidation process at a high temperature for a lengthy period. In this regard, there may be a possibility of the substrate 31 to be deformed by the thermal energy applied to the substrate 31 during the thermal oxidation process. However, in an embodiment, it may be possible to more effectively prevent the substrate 31 from being deformed during the process of forming the dielectric layer 40, by the first and second hard mask layers 33 and 34, which may be formed on the upper and lower surfaces of the substrate 31.

Meanwhile, when forming the dielectric layer 40 which may fill the second trench 37B, chemical vapor deposition (CVD), physical vapor deposition (PVD), or spin coating may be used instead of the thermal oxidation. However, because the dielectric layer 40, which may be formed through a deposition or coating method other than the thermal oxidation, may have poor film quality as compared to the dielectric layer 40, which may be formed through the thermal oxidation, the loss of (or damage to) the dielectric layer 40 may be more likely to occur during a subsequent process, and a problem may be caused in that capacitance increases due to the poor film quality. Also, the deposition or coating method other than the thermal oxidation may not selectively fill only the inside of the second trench 37B. Therefore, because the dielectric layer 40 filling the second trench 37B may be formed through a series of processes of depositing the dielectric layer 40 to entirely fill the outer trench 37, and partially etching the dielectric layer 40 filling the outer trench 37, a processing procedure may be relatively complicated as compared to forming the dielectric layer 40 through the thermal oxidation, whereby the productivity of the semiconductor device may be decreased. Furthermore, when it is desired to increase the depth of the second trench 37B, depending upon the desired characteristics of the semiconductor device, it may be more difficult to stably form the dielectric layer 40 filling the second trench 37B without defects (for example, voids) through the deposition or coating method other than the thermal oxidation.

Due to the characteristics of the thermal oxidation in which the oxide layer grows from the surface of the substrate 31, a keyhole may be created in the dielectric layer 40 (see the reference symbol "A"). As the keyhole created in the dielectric layer 40 may degrade the characteristics of the semiconductor device during subsequent processes, it may be advantageous to remove the keyhole.

Figure 2E:
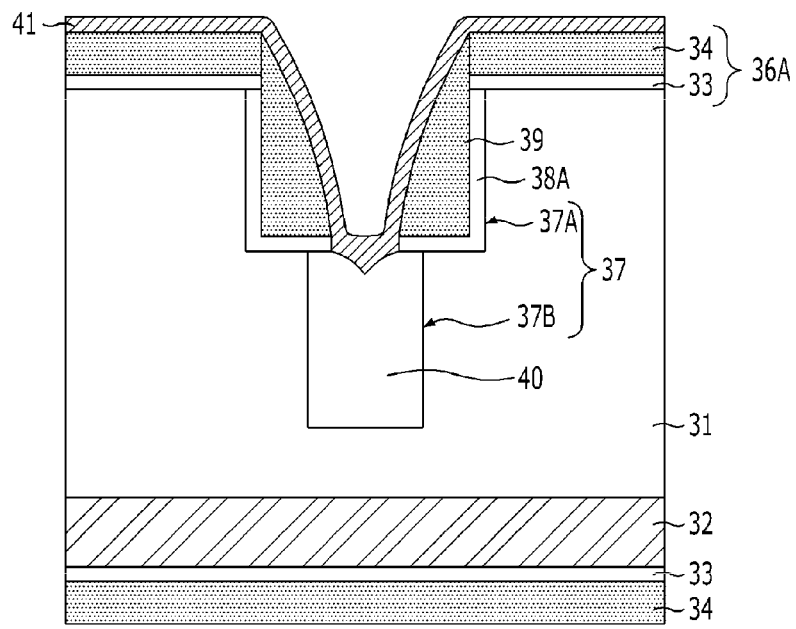

Referring to FIG. 2E, a sacrificial layer 41 may be formed on the upper surface of the semiconductor structure (see FIG. 2D), including the dielectric layer 40. The sacrificial layer 41 may be formed as a silicon layer. A polysilicon layer may be used as the silicon layer. Embodiments are not intended to be limited to the above examples.

For example, the sacrificial layer 41 may be formed to have a thickness capable of filling the keyhole created in the dielectric layer 40. For example, the sacrificial layer 41 may be formed to have a thickness ranging from, e.g., approximately 200 Å to approximately 400 Å. For reference, in the event that the sacrificial layer 41 has a thickness less than, e.g., approximately 200 Å, the keyhole may be more unlikely to be sufficiently filled. In the event that the sacrificial layer 41 has a thickness greater than approximately 400 Å, the sacrificial layer 41 may be more unlikely to be entirely converted into a dielectric layer in a subsequent process.

Figure 2F:
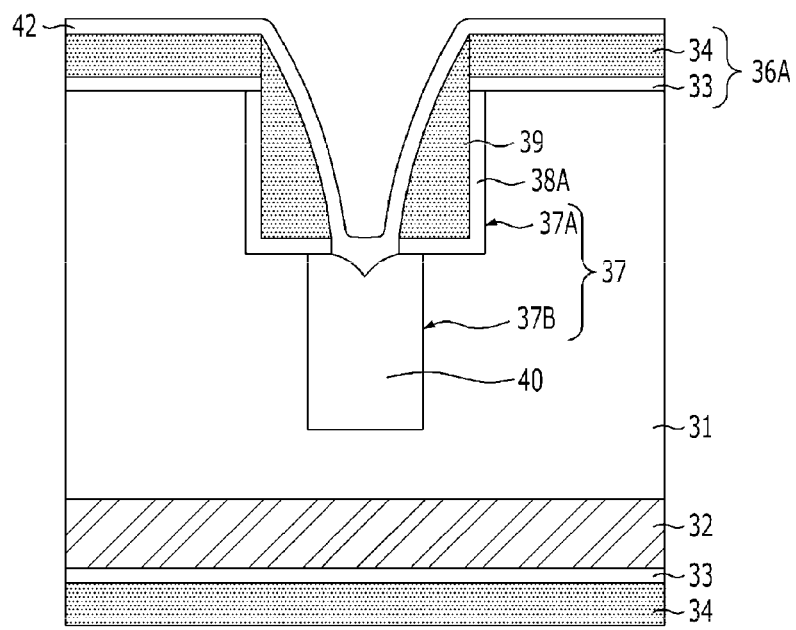

Referring to FIG. 2F, the sacrificial layer 41 may be converted into the same layer as the dielectric layer 40, e.g., an oxide layer, through performing a conversion process (or a substitution process). For example, the sacrificial layer 41 may be converted into the oxide layer by performing an oxidation process. The sacrificial layer 41, which may be converted into the oxide layer, will be designated by the reference numeral 42.

The oxidation process for converting the sacrificial layer 41 into the same layer as the dielectric layer 40 may be implemented in such a way of performing annealing under an oxygen atmosphere, and in order to improve reactivity, a plasma atmosphere may be additionally employed.

Meanwhile, the same layer as the dielectric layer 40, that is, the oxide layer, may be deposited through chemical vapor deposition or physical vapor deposition without forming the sacrificial layer 42 to fill the keyhole. In this regard, in order to obtain the oxide layer which may not only fill the keyhole but may also have improved film quality, forming the sacrificial layer 42 through the conversion process may be more preferable than forming the sacrificial layer 42 through chemical vapor deposition or physical vapor deposition.

Figure 2G:
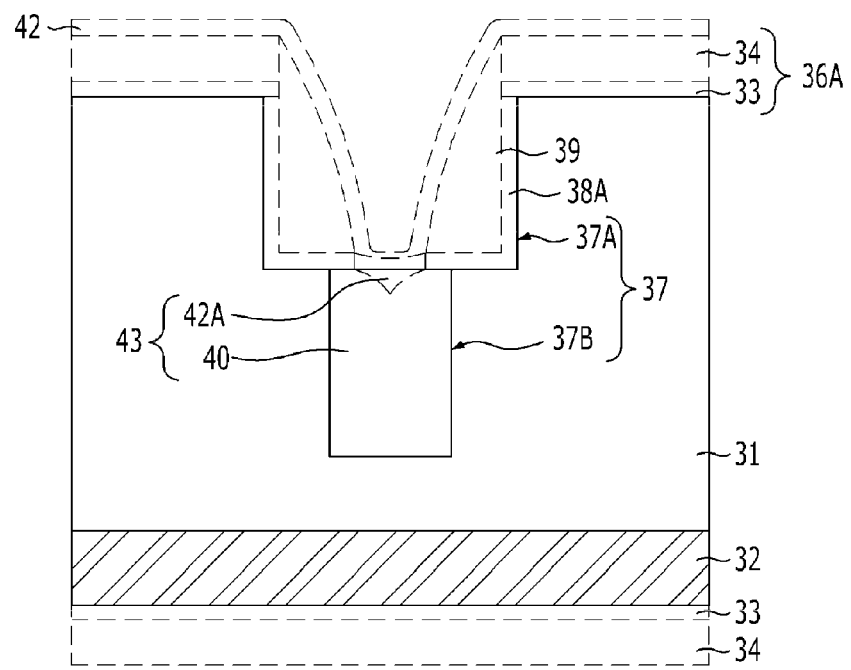

Referring to FIG. 2G, by selectively etching the other portion of the sacrificial layer 42, except the portion of the sacrificial layer 42 filled in the keyhole, that is, present on the sidewalls of the first trench 37A and the surface of the hard mask pattern 36A, the sacrificial layer 42 may remain only in the keyhole. For example, an etching process for allowing the sacrificial layer 42 to remain only in the keyhole may be performed through we etching. The etched sacrificial layer 42 will be designated by the reference numeral 42A.

Through the above-described processes, a bottom dielectric layer 43, which may include the dielectric layer 40 filling the second trench 37B and the sacrificial layer 42A filling the keyhole created in the dielectric layer 40, may be formed.

The second hard mask layers 34 which may be formed on the upper and lower surfaces of the substrate 31 and the spacers 39 may be removed. For example, the second hard mask layers 34 and the spacers 39 may be removed through we etching, and a phosphoric acid solution may be used as an etching solution.

By removing the first hard mask layers 33 which may be formed on the upper and lower surfaces of the substrate 31 and the sacrificial dielectric layer 38A, the surfaces of the first trench 37A may be exposed. For example, the first hard mask layers 33 and the sacrificial dielectric layer 38A may be removed through we etching, and a hydrofluoric acid solution or a BOE solution may be used as an etching solution.

One reason to expose all the surfaces of the first trench 37A is because a gate dielectric layer and a gate electrode may be formed in the first trench 37A through subsequent processes. In other words, in the event that the already formed bottom dielectric layer 43 remains in the first trench 37A, preset shapes of the gate dielectric layer and the gate electrode may be changed due to the presence of the bottom dielectric layer 43. As such, the operation characteristics of the semiconductor device may be more likely to be degraded.

One reason why all the processes for removing the first and second hard mask layers 33 and 34, the sacrificial layer 42, and the sacrificial dielectric layer 38A may be performed through wet etching may be to prevent the already formed semiconductor structure from being damaged (or lost). If the removing processes are performed through dry etching, the shape of the already formed structure may be more likely to be changed by accelerated particles or plasma, and the operation characteristics of the semiconductor device may be more likely to be degraded.

Figure 2H:
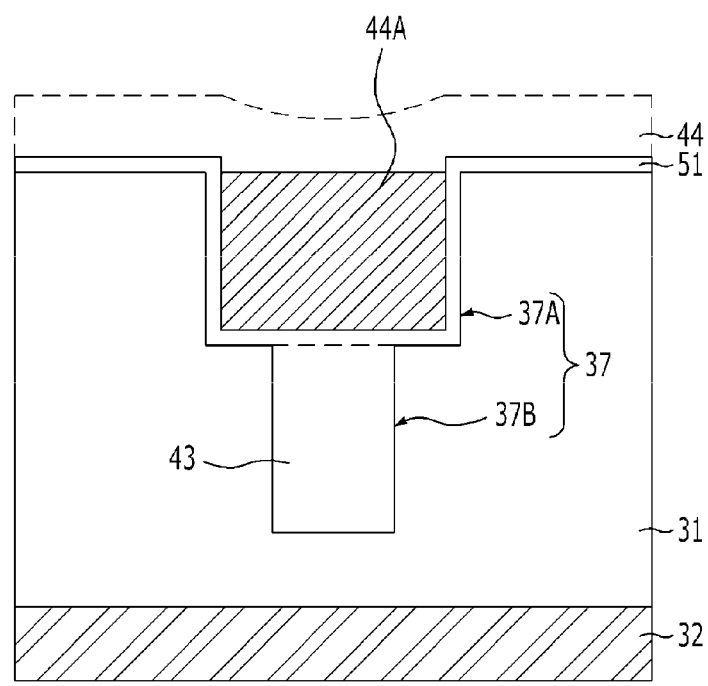

Referring to FIG. 2H, a gate dielectric layer 51 may be formed on the upper surface of the substrate 31 and the surfaces of the first trench 37A. The gate dielectric layer 51 may be formed as an oxide layer, for example, a silicon oxide layer. The silicon oxide layer for the gate dielectric layer 51 may be formed through, e.g., thermal oxidation.

A gate conductive layer 44 may be formed on the gate dielectric layer 51 over the entire surface of the substrate 31 in such a way as to fill the remaining portion of the outer trench 37. The gate conductive layer 44 may be formed as a single layer of a silicon layer or a metallic layer, or as a stack layer in which a silicon layer and a metallic layer are stacked.

By selectively etching the gate conductive layer 44, a gate electrode 44A, which may fill the remaining portion of the outer trench 37, may be formed. The gate electrode 44A may be formed through performing blanket etching such as etchback or planarization such as chemical mechanical polishing (CMP) until the gate dielectric layer 51 formed on the upper surface of the substrate 31 is exposed.

Figure 2I:
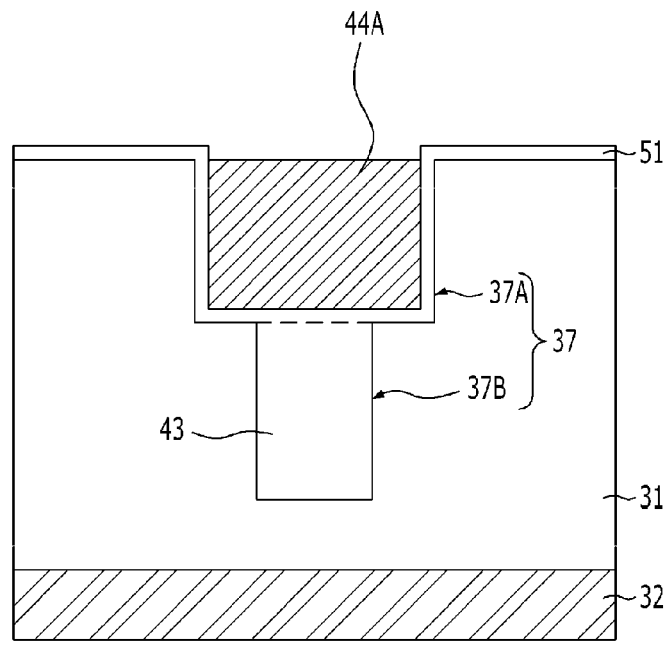
Figure 2J:
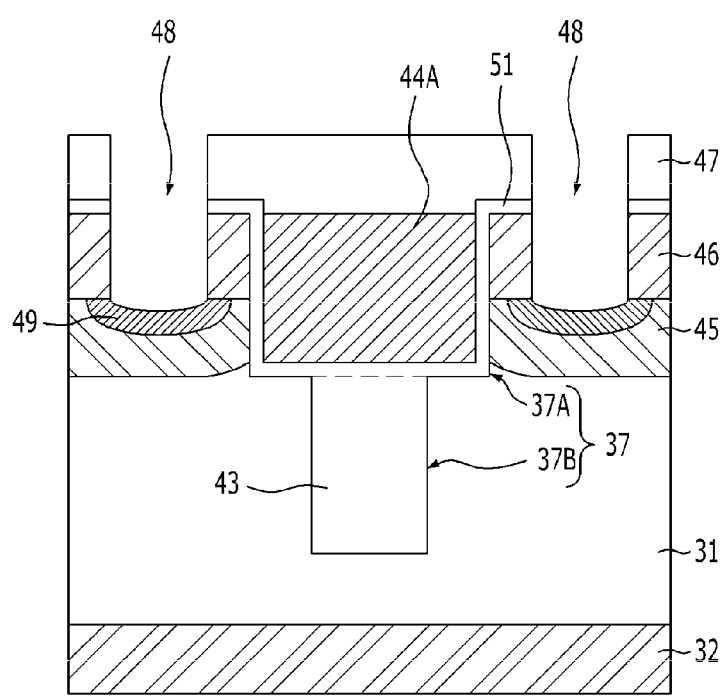

Referring to FIGS. 2I and 2J, a well 45 of a first conductivity type and a source region 46 of a second conductivity type may be formed on both sides of the outer trench 37 by implanting impurity ions into the substrate 31. For example, the height of the well 45 may be set to be greater than the height of the source region 46, as viewed from (from the perspective of) the upper surface of the substrate 31, and the depth of the well 45 may be set to be the same as or less than the depth of the first trench 37A. The substrate 31 between the well 45 and the drain region 32 may serve as a drift region. For example, in order to prevent capacitance from being induced between the drift region and the gate electrode 44A, the depth of the well 45 may be set to be the same as the depth of the first trench 37A.

The gate dielectric layer 51 which may be formed on the upper surface of the substrate 31 may serve as a screen barrier when performing an ion implantation process for forming the well 45 and the source region 46.

After forming an interlayer dielectric layer 47 to cover the entire surface of the substrate 31, e.g., by etching the interlayer dielectric layer 47 and the substrate 31 of the source region 46, a contact hole 48 may be formed to expose the upper surface of the well 45. The contact hole 48 may form a wiring line (e.g., wiring line 50 in FIG. 2K), which may connect the source region 46 and the well 45.

By implanting impurity ions of the first conductivity type into the well 45 of the substrate 31 which may be exposed due to the formation of the contact hole 48, a contact region 49 of the first conductivity type may be formed. The contact region 49 may function to improve the contact properties between the wiring line, to be formed through a subsequent process, and the well 45.

Figure 2K:
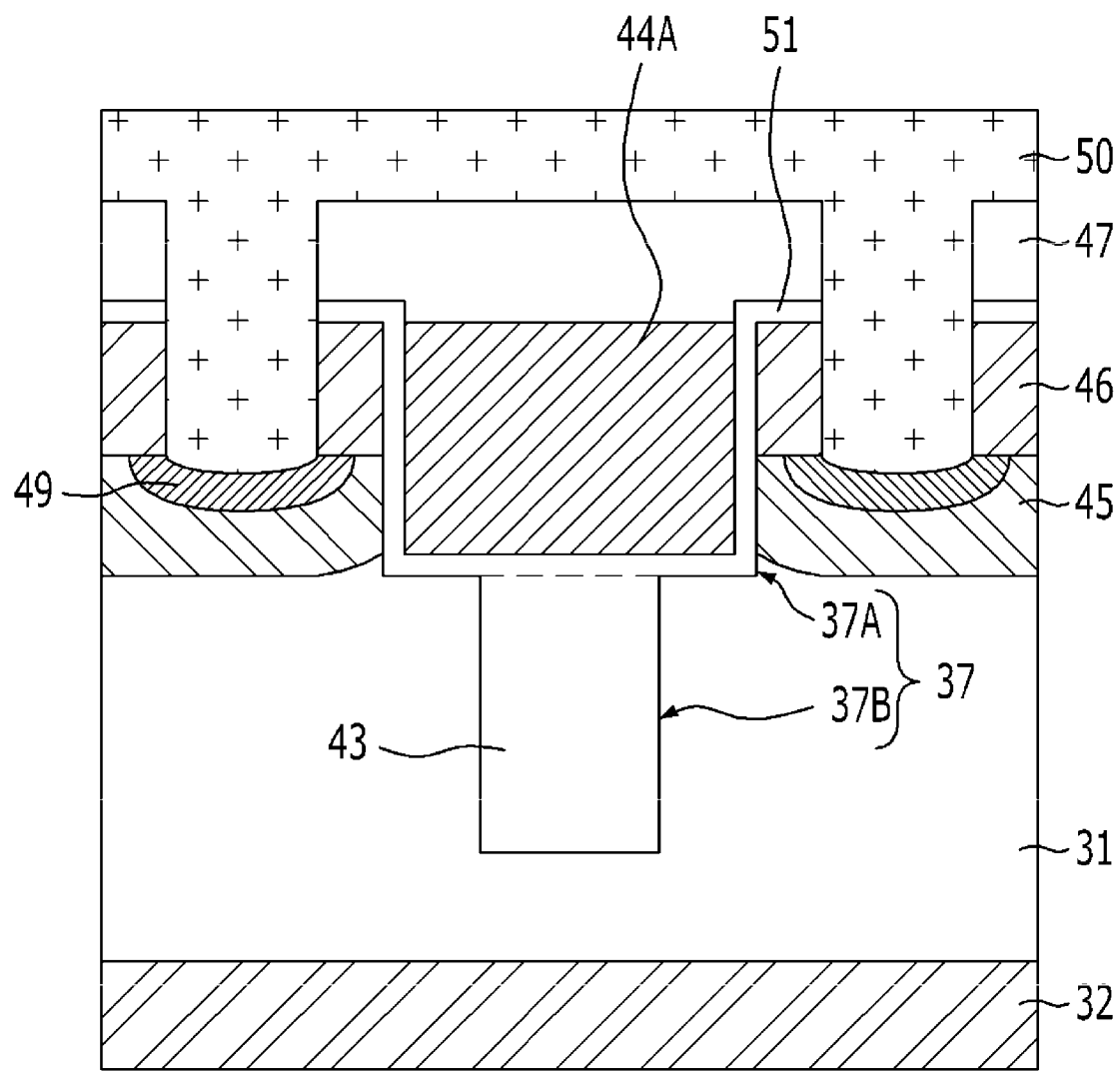

Referring to FIG. 2K, a wiring line 50 may be formed to fill the contact hole 48.

In an embodiment, by forming the dielectric layer 40 which may fill the second trench 37B and may have a width (e.g., width W2) less than that of the first trench 37A (e.g., width W1), the capacitance between the gate electrode 44A and the drain region 32 may be decreased, whereby the switching speed of the semiconductor device may be increased. Furthermore, the specific on-resistance of the semiconductor device may be reduced.

In addition, by removing the keyhole created in the dielectric layer 40 which may fill the second trench 37B, it may be possible to prevent the operation characteristics of the semiconductor device from being degraded due to the presence of the keyhole.

As is apparent from the above description, in an embodiment, due to the fact that a dielectric layer, which may fill a second trench (e.g., second trench 37B) and may have a width (e.g., width W2) less than that of a first trench (e.g., width W1 of first trench 37A), may be formed, capacitance between a gate electrode and a drain region may be decreased, and the switching speed of a semiconductor device may be increased. Also, since the dielectric layer may be formed to have the width less than that of the first trench, the specific on-resistance of the semiconductor device may be reduced.

Furthermore, in an embodiment, because the dielectric layer may be formed through a thermal oxidation process, the depth (or height) of the dielectric layer may be increased to be greater than the depth (or height) of the second trench. As such, capacitance between the gate electrode and the drain region may be more effectively decreased.

Moreover, in an embodiment, a key hole defined in the dielectric layer which fills the second trench is removed, whereby it is possible to prevent the characteristics of the semiconductor device from being degraded due to the presence of the key hole.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a semiconductor device, the method comprising:
   forming an outer trench, comprising:
     a first trench; and
     a second trench formed under the first trench, the second trench being formed by etching a substrate;
   forming a dielectric layer, which fills the second trench, by performing a thermal oxidation process, such that a width of the second trench is less than a width of the first trench;
   forming a gate dielectric layer along a surface of a semiconductor structure comprising the dielectric layer; and
   forming a gate electrode, which fills a remaining portion of the outer trench, over the gate dielectric layer.

2. The method of claim 1, further comprising, before forming the first trench, forming a drain region of a second conductivity type over a lower surface of the substrate.

3. The method of claim 1, wherein the dielectric layer comprises a silicon oxide layer.

4. The method of claim 1, wherein the forming of the trench comprises:
   forming a hard mask pattern over the substrate;
   forming the first trench by etching the substrate using the hard mask pattern as an etch barrier;
   forming spacers on sidewalls of the first trench; and
   forming the second trench by etching a portion of the substrate which is placed under the first trench, using the hard mask pattern and the spacers as an etch barrier.

5. The method of claim 1, further comprising, before the forming of the gate dielectric layer, filling a keyhole created in the dielectric layer.

6. The method of claim 1, further comprising, after the forming of the gate electrode:
   forming a well of a first conductivity type in the substrate on each side of the trench;
   forming a source region of a second conductivity type in the well;
   forming an interlayer dielectric layer on an entire surface of the substrate;
   forming a contact hole which exposes the well through the source region, by selectively etching the interlayer dielectric layer and the substrate;
   forming a contact region by implanting impurity ions of the first conductivity type into a bottom surface of the contact hole; and
   forming a wiring line which fills the contact hole.

7. The method of claim 4, further comprising, before forming the spacers:
   forming a sacrificial dielectric layer over surfaces of the first trench; and
   etching partially the sacrificial dielectric layer to be flush with edges of the hard mask pattern.

8. The method of claim 4, wherein the sacrificial dielectric layer is formed through a thermal oxidation process.

9. The method of claim 4, further comprising forming a deformation preventing layer over the lower surface of the substrate at the same time as forming the hard mask pattern.

10. The method of claim 7, wherein the forming of the spacers comprises:
    forming a nitride layer over the sacrificial dielectric layer; and
    forming the spacers by performing a blanket etching process for the nitride layer.

11. The method of claim 7, wherein the forming of the gate dielectric layer is implemented on an entire exposed surface of the substrate by performing a thermal oxidation process, after the hard mask pattern, the spacers, and the sacrificial dielectric layer are removed.

12. The method of claim 10, wherein:
    the sacrificial dielectric layer comprises an oxide layer; and
    the spacers comprise a nitride layer.

13. The method of claim 11, further comprising, before the forming of the gate dielectric layer, filling a keyhole created in the dielectric layer.

14. The method of claim 12, wherein each of the hard mask pattern and the deformation preventing layer is formed as a triple layer in which an oxide layer, a nitride layer, and an oxide layer are sequentially stacked.

15. The method of claim 5, wherein the filling of the keyhole comprises:
    depositing a sacrificial layer along a surface of a structure to fill the keyhole created in the dielectric layer;
    converting the sacrificial layer into the same layer as the dielectric layer; and
    removing the other portion of the sacrificial layer, except one portion of the sacrificial layer filled in the keyhole.

16. The method of claim 15, wherein:
    the sacrificial layer comprises a silicon layer; and
    the sacrificial layer is converted into a silicon oxide layer through a thermal oxidation process performed under an oxygen atmosphere.

17. The method of claim 15, wherein the sacrificial layer is formed to have a thickness capable of filling the keyhole.

18. The method of claim 16, wherein the sacrificial layer is formed to have a thickness of approximately 200 Å to approximately 400 Å.

19. The method of claim 6, wherein a depth of the well is set to be the same as or less than a depth of the first trench from a perspective of an upper surface of the substrate.

* * * * *